United States Patent
Liou et al.

(10) Patent No.: US 9,494,873 B2
(45) Date of Patent: Nov. 15, 2016

(54) ASYMMETRY COMPENSATION METHOD USED IN LITHOGRAPHY OVERLAY PROCESS

(71) Applicant: UNITED MICROELECTRONICS CORPORATION, Hsinchu (TW)

(72) Inventors: En-Chiuan Liou, Tainan (TW); Teng-Chin Kuo, Taipei (TW); Yuan-Chi Pai, Tainan (TW); Chun-Chi Yu, Taipei (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 309 days.

(21) Appl. No.: 14/470,955

(22) Filed: Aug. 28, 2014

(65) Prior Publication Data

US 2016/0018741 A1    Jan. 21, 2016

(30) Foreign Application Priority Data

Jul. 16, 2014 (CN) .......................... 2014 1 0338417

(51) Int. Cl.
    *G03F 7/20* (2006.01)
(52) U.S. Cl.
    CPC .................................. *G03F 7/70633* (2013.01)
(58) Field of Classification Search
    CPC .................................................. G03F 7/70633
    See application file for complete search history.

(56) References Cited

U.S. PATENT DOCUMENTS

| | | | | |
|---|---|---|---|---|
| 6,380,554 | B1* | 4/2002 | Bush ................... | G03F 7/70633 257/48 |
| 2002/0048928 | A1* | 4/2002 | Nakagawa .......... | H01L 21/7682 438/619 |
| 2003/0039905 | A1* | 2/2003 | Schedel .............. | G03F 7/70625 430/30 |
| 2004/0101983 | A1* | 5/2004 | Jones ...................... | H01L 22/20 438/14 |
| 2005/0110012 | A1* | 5/2005 | Lee ...................... | G03F 7/70633 257/48 |
| 2012/0038021 | A1* | 2/2012 | Chen ................... | G03F 7/70633 257/506 |
| 2012/0094400 | A1 | 4/2012 | Adel | |
| 2014/0375793 | A1* | 12/2014 | Harada ................. | H01L 23/544 348/80 |

* cited by examiner

*Primary Examiner* — Steven H Whitesell Gordon
(74) *Attorney, Agent, or Firm* — Ding Yu Tan

(57) ABSTRACT

An asymmetry compensation method used in a lithography overlay process and including steps of: providing a first substrate, wherein a circuit layout is disposed on the first substrate, a first mask layer and a second mask layer together having an x-axis allowable deviation range and an y-axis allowable deviation range relative to the circuit layout are stacked sequentially on the circuit layout, wherein the x-axis allowable deviation range is unequal to the y-axis allowable deviation range; and calculating an x-axis final compensation parameter and an y-axis final compensation parameter base on the unequal x-axis allowable deviation range and the y-axis allowable deviation range.

13 Claims, 1 Drawing Sheet

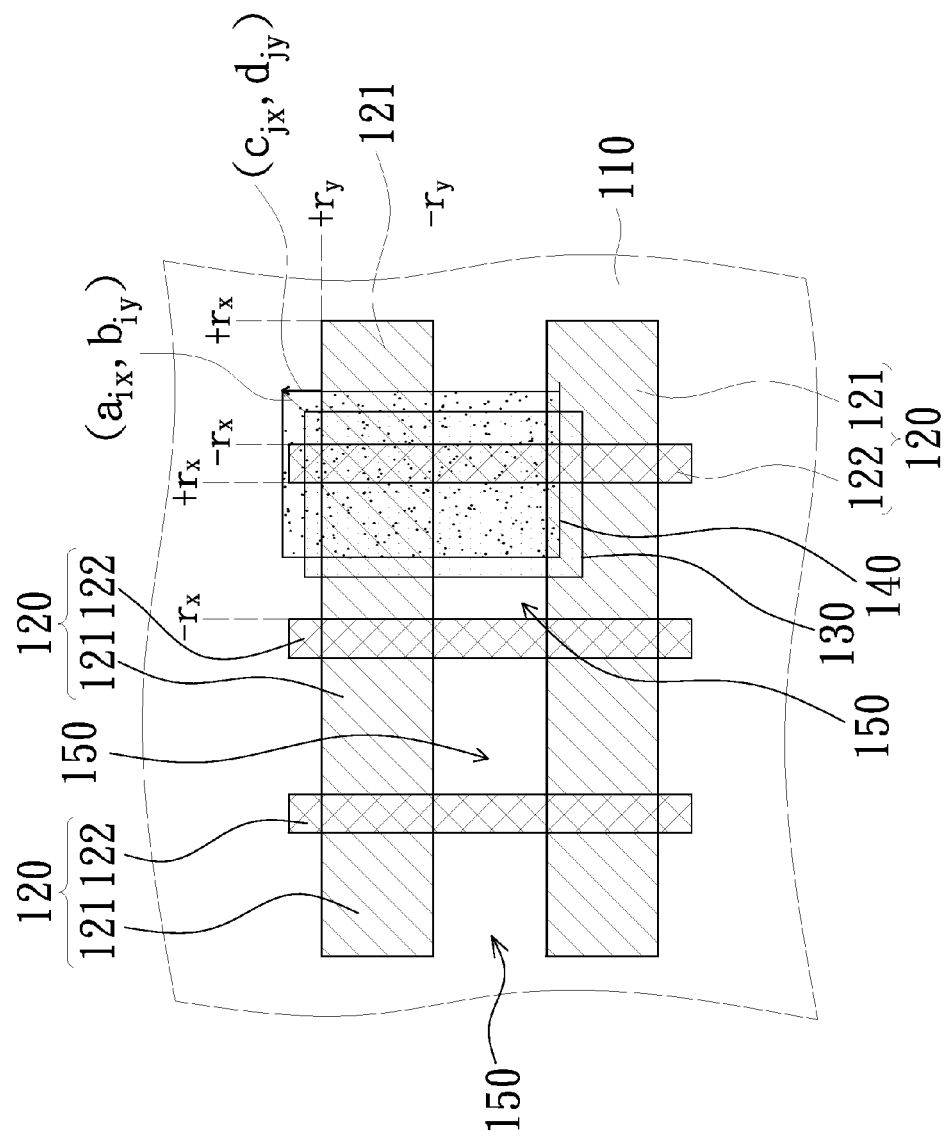

ASYMMETRY COMPENSATION METHOD USED IN LITHOGRAPHY OVERLAY PROCESS

FIELD OF THE INVENTION

The present invention relates to a compensation method, and more particularly to an asymmetry compensation method used in a lithography overlay process.

BACKGROUND OF THE INVENTION

A lithography overlay process is used in a semiconductor manufacturing process to achieve layer to layer interconnections. In a wafer manufacturing process or an integrating process, based on characteristics of different circuit line widths, complex circuit elements are formed and stacked on a wafer by using different masks to perform lithography overlay processes. But in the lithography overlay process, steppers, the wafer, and a processing environment will cause a so-called overlay error, wherein the overlay error will cause a displacement error between two mask layers. Besides, with continually shrinking critical dimensions, larger and larger wafer sizes, and increased mask numbers, an accuracy of the lithography overlay needs higher and higher. When an overlay error exceeds an error tolerance, a displacement error resulting from the overlay error may cause open circuits or short circuits and make an interlayer design circuit become useless after an electrical testing, thereby reducing a product yield.

In conventional lithography overlay processes, a symmetrical compensation method is only provided to adjust parameters and thus reduce overlay errors. But for a semiconductor device, there is not only a symmetrical circuit region with a width equal to a length disposed on a wafer, but also an asymmetric circuit region with a width unequal to a length disposed on the wafer. Traditional symmetrical compensation method includes compensating an x-axis offset and an y-axis offset with the same parameter. However, the symmetrical compensation method is only applied in the lithography overlay process of the wafer having the symmetrical circuit region, wherein the symmetrical circuit region has the width equal to the length. So the traditional symmetrical compensation method cannot satisfy an accuracy requirement of the wafer having the asymmetrical circuit region after compensating, wherein the asymmetrical circuit region has the width unequal to the length. In other words, for the wafer having the asymmetrical circuit region, the traditional symmetrical compensation method including compensating the x-axis offset and the y-axis offset with the same parameter cannot reduce the overlay errors effectively.

In view of the aforementioned reasons, there is a need to provide a new compensation method to reduce overlay errors of a wafer having an asymmetry circuit region after processing with a lithography overlay process.

SUMMARY OF THE INVENTION

The present invention provides an asymmetry compensation method used in a lithography overlay process to enhance yield of a semiconductor device after performing with a lithography overlay process.

In order to achieve the aforementioned advantages or other merits, an asymmetry compensation method used in a lithography overlay process is provided in an embodiment of the present invention. The asymmetry compensation method used in a lithography overlay process includes steps of: providing a first substrate, wherein a circuit layout, a first mask layer, and a second mask layer are disposed on the first substrate, the first mask layer and the second mask layer are stacked sequentially on the circuit layout, wherein the first mask layer has an x-axis allowable deviation range and an y-axis allowable deviation range relative to the circuit layout, the second mask layer has an x-axis allowable deviation range and an y-axis allowable deviation range relative to the circuit layout, the x-axis allowable deviation range is unequal to the y-axis allowable deviation range; and calculating an x-axis final compensation parameter and an y-axis final compensation parameter based on the unequal x-axis allowable deviation range and the y-axis allowable deviation range.

An asymmetry compensation method used in a lithography overlay process is further provided in another embodiment of the present invention. The asymmetry compensation method used in a lithography overlay process includes steps of: providing a first substrate, wherein a circuit layout, a first mask layer, and a second mask layer are disposed on the first substrate, the first mask layer and the second mask layer are stacked sequentially on the circuit layout, wherein the first mask layer has an x-axis allowable deviation range and an y-axis allowable deviation range relative to the circuit layout, the second mask layer has an x-axis allowable deviation range and an y-axis allowable deviation range relative to the circuit layout, the x-axis allowable deviation range is unequal to the y-axis allowable deviation range; and calculating an x-axis final compensation parameter and an y-axis final compensation parameter based on the unequal x-axis allowable deviation range and the y-axis allowable deviation range, comprising: obtaining a first x-axis offset and a first y-axis offset of the first mask layer relative to the second mask layer; determining that whether the first x-axis offset and the first y-axis offset respectively fall within the x-axis allowable deviation range and the y-axis allowable deviation range or not; calculating an offset difference between the first x-axis offset and the x-axis allowable deviation range as well as between the first y-axis offset and the y-axis allowable deviation range to obtain a second x-axis offset and a second y-axis offset; and calculating a sum of a first multiple of the first x-axis offset and a second multiple of the second x-axis offset to obtain the x-axis final compensation parameter, as well as calculating a sum of the first multiple of the first y-axis offset and the second multiple of the second y-axis offset to obtain the y-axis final compensation parameter, wherein if the first x-axis offset falls within the x-axis allowable deviation range, then the second x-axis offset is zero, and/or if the first y-axis offset falls within the y-axis allowable deviation range, then the second x-axis offset is zero.

In summary, the asymmetry compensation methods provided in the present invention can be used in a lithography overlay process of a substrate or a wafer having a circuit layout, wherein the circuit layout has an asymmetry element region with a width unequal to a length. So the asymmetry compensation methods provided in the present invention can make a number of mask layers formed in a lithography overlay process be stacked relatively accurately onto a substrate and fall within a desired region of a circuit layout, and thus a product yield can be enhanced.

For making the above and other purposes, features and benefits become more readily apparent to those ordinarily skilled in the art, the preferred embodiments and the detailed descriptions with accompanying drawings will be put forward in the following descriptions.

BRIEF DESCRIPTION OF THE DRAWINGS

The present invention will become more readily apparent to those ordinarily skilled in the art after reviewing the following detailed description and accompanying drawings, in which:

FIG. 1 is a schematic diagram of a substrate used for illustrating an asymmetry compensation method used in a lithography overlay process in accordance with an embodiment of the present invention.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

FIG. 1 is a schematic diagram of a substrate used for illustrating an asymmetry compensation method used in a lithography overlay process in accordance with an embodiment of the present invention. Please refer to FIG. 1. The asymmetry compensation method used in a lithography overlay process includes a step of: providing a first substrate 110 firstly, wherein a circuit layout 120, a first mask layer 130, and a second mask layer 140 are disposed on the first substrate 110, the first mask layer 130 and the second mask layer 140 are stacked sequentially on the circuit layout 120. The first mask layer 130 has an x-axis allowable deviation range $\pm r_x$ and an y-axis allowable deviation range $\pm r_y$ relative to the circuit layout 120, and the second mask layer 140 also has an x-axis allowable deviation range $\pm r_x$ and an y-axis allowable deviation range $\pm r_y$ relative to the circuit layout 120, wherein the x-axis allowable deviation range $\pm r_x$ is unequal to the y-axis allowable deviation range $\pm r_y$.

The circuit layout 120 includes a plurality of first element regions 121 and a plurality of second strip-like element regions 122, as shown in FIG. 1. Each of the second strip-like element regions 122 is disposed between two of the first element regions 121 that are adjacent to one another and are transversely arranged, and a groove 150 is located between two of the first element regions 121 that are adjacent to one another and are arranged longitudinally. Each of the first element regions 121 is an asymmetric region with a width unequal to a length, such as a rectangular shape. At least one endpoint of the first mask layer 130 and at least one endpoint of the second mask layer 140 are expected to be located within a range of the first element region 121, instead of being located within a range of the second strip-like element region 122. Besides, since the first element region 121 has the width unequal to the length, so the endpoint of the first mask layer 130 and the endpoint of the second mask layer 140 are expected to be located together within the x-axis allowable deviation range $\pm r_x$ and the y-axis allowable deviation range $\pm r_y$, wherein the x-axis allowable deviation range $\pm r_x$ is unequal to the y-axis allowable deviation range $\pm r_y$. It is worth mentioning that the substrate schematic view of FIG. 1 is merely used for illustrating the asymmetry compensation method of the present invention, but a type of substrate is not limited thereto.

Please continually refer to FIG. 1. After providing the first substrate 110, the asymmetry compensation method further includes a step of calculating an x-axis final compensation parameter and an y-axis final compensation parameter based on the unequal x-axis allowable deviation range and the y-axis allowable deviation range. The step of calculating the x-axis final compensation parameter and the y-axis final compensation parameter based on the unequal x-axis allowable deviation range and the y-axis allowable deviation range includes a step of: firstly, obtaining a coordinate offset $(a_{ix}, b_{iy})$ of the first mask layer 130 relative to the second mask layer 140, wherein the coordinate offset $(a_{ix}, b_{iy})$ includes a first x-axis offset $a_{ix}$ and a first y-axis offset $b_{iy}$.

Please continually refer to FIG. 1. Secondly, after obtaining the coordinate offset $(a_{ix}, b_{iy})$, the step of calculating an x-axis final compensation parameter and an y-axis final compensation parameter further include a step of: determining that whether the first x-axis offset $a_{ix}$ falls within the x-axis allowable deviation range $\pm r_x$ or not, and determining that whether the first y-axis offset $b_{iy}$ falls within the y-axis allowable deviation range $\pm r_y$ or not; and thirdly, calculating an offset difference $(c_{jx}, d_{jy})$ between the first x-axis offset $a_{ix}$ of the coordinate offset $(a_{ix}, b_{iy})$ and the x-axis allowable deviation range $\pm r_x$, as well as between the first y-axis offset $b_{iy}$ of the coordinate offset $(a_{ix}, b_{iy})$ and the y-axis allowable deviation range $\pm r_y$, to obtain a second x-axis offset $c_{jx}$ and a second y-axis offset $d_{jy}$. The offset difference $(c_{jx}, d_{jy})$ includes the second x-axis offset $c_{jx}$ and the second y-axis offset $d_{jy}$. If the first x-axis offset $a_{ix}$ falls within the x-axis allowable deviation range $\pm r_x$, then the second x-axis offset $c_{jx}$ is zero. If the first y-axis offset $b_{iy}$ falls within the y-axis allowable deviation range $\pm r_y$, then the second y-axis offset $d_{jy}$ is zero. The numerical value of the second x-axis offset $c_{jx}$ and the second y-axis offset $d_{jy}$ can be calculated according to the following conditions and equations:

in a case of $a_{ix} \geq 0$: if $a_{ix} > r_x$, then $c_{jx} = a_{ix} - r_x$, but if $a_{ix} \leq r_x$, then $c_{jx} = 0$;

in a case of $b_{iy} \geq 0$: if $b_{iy} > r_y$, then $d_{jy} = b_{iy} - r_y$, but if $b_{iy} \leq r_y$, then $d_{jy} = 0$;

in a case of $a_{ix} < 0$: if $a_{ix} < -r_x$, then $c_{jx} = a_{ix} + r_x$, but if $a_{ix} \geq -r_x$, then $c_{jx} = 0$;

in a case of $b_{iy} < 0$: if $b_{iy} < -r_y$, then $d_{jy} = b_{iy} + r_y$, but if $b_{iy} \geq -r_y$, then $d_{jy} = 0$.

As illustrated in FIG. 1, it is understood that the offset difference $(c_{jx}, d_{jy})$ in this embodiment is exemplified by a vertical vector, wherein the vertical vector includes a value of the second x-axis offset $c_{jx}$ and a value of the second y-axis offset $d_{jy}$, the value of the second x-axis offset $c_{jx}$ is zero because of the first x-axis offset $a_{ix}$ falls within the x-axis allowable deviation range $\pm r_x$ and the value of the second y-axis offset $d_{jy}$ is not equal to zero because of the first y-axis offset $b_{iy}$ falls outside the y-axis allowable deviation range $\pm r_y$; and the present invention is not limited thereto.

Please continually refer to FIG. 1. After obtaining the second x-axis offset $c_{jx}$ and the second y-axis offset $d_{jy}$, the step of calculating an x-axis final compensation parameter and an y-axis final compensation parameter further include a step of: calculating a sum of a first multiple α of the coordinate offset $(a_{ix}, b_{iy})$ and a second multiple β of the offset difference $(c_{jx}, d_{jy})$ to obtain a x-axis compensation parameter $(\alpha a_{ix} + \beta c_{jx})$ and a y-axis compensation parameter $(\alpha b_{iy} + \beta d_{jy})$ together serving as a final compensation parameter $(\alpha a_{ix} + \beta c_{jx}, \alpha b_{iy} + \beta d_{jy})$. The first multiple α is greater than zero or equal to 1, the second multiple β is greater than zero and less than 1.

It is worth mentioning that the final compensation parameter ($\alpha a_{ix}+\beta c_{jx}$, $\alpha b_{iy}+\beta d_{jy}$) is suitable for being used in a re-lithography overlay process of the first substrate 110 after removing the first mask layer 130 and the second mask layer 140, wherein the re-lithography overlay process includes processing the re-lithography overlay process on the first substrate 110 by using a first mask, a second mask (not shown in FIG. 1), and the final compensation parameter ($\alpha a_{ix}+\beta c_{jx}$, $\alpha b_{iy}+\beta d_{jy}$). The final compensation parameter ($\alpha a_{ix}+\beta c_{jx}$, $\alpha b_{iy}+\beta d_{jy}$) can produce a negative offset, so that a new first mask layer formed by the first mask and a new second mask layer formed by the second mask can be re-stacked relatively accurately onto the first substrate 110 and fall within a desired region of the circuit layout 120.

In addition, the final compensation parameter ($\alpha a_{ix}+\beta c_{jx}$, $\alpha b_{iy}+\beta d_{jy}$) is also suitable for being used in a lithography overlay process of next substrate after completing the first substrate, such as a second substrate (not shown in figures). The lithography overlay process of the second substrate includes processing the lithography overlay process on the second substrate by using a first mask, a second mask, and the final compensation parameter, so as to make a new first mask layer formed by the first mask and a new second mask layer formed by the second mask to be stacked relatively accurately onto the second substrate and fall within a desired region of the circuit layout.

In summary, the asymmetry compensation methods provided in the present invention can be used in a lithography overlay process of a substrate or a wafer having a circuit layout, wherein the circuit layout has an asymmetry element region with a width unequal to a length. So the asymmetry compensation methods provided in the present invention can make a number of mask layers formed in a lithography overlay process be stacked relatively accurately onto a substrate and fall within a desired region of a circuit layout, and thus a product yield can be enhanced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An asymmetry compensation method used in a lithography overlay process, comprising:
providing a first substrate, wherein a circuit layout, a first mask layer, and a second mask layer are disposed on the first substrate, the first mask layer and the second mask layer are stacked sequentially on the circuit layout, wherein the first mask layer has an x-axis allowable deviation range and an y-axis allowable deviation range relative to the circuit layout, the second mask layer has an x-axis allowable deviation range and an y-axis allowable deviation range relative to the circuit layout, the x-axis allowable deviation range is unequal to the y-axis allowable deviation range; and
calculating an x-axis final compensation parameter and an y-axis final compensation parameter based on the unequal x-axis allowable deviation range and the y-axis allowable deviation range.

2. The asymmetry compensation method according to claim 1, wherein the step of calculating the x-axis final compensation parameter and the y-axis final compensation parameter based on the unequal x-axis allowable deviation range and the y-axis allowable deviation range comprises:
obtaining a coordinate offset of the first mask layer relative to the second mask layer;
calculating an offset different between the coordinate offset and the x-axis allowable deviation range and between the coordinate offset and the y-axis allowable deviation range; and
calculating a sum of a first multiple of the coordinate offset and a second multiple of the offset different to obtain the x-axis final compensation parameter and the y-axis final compensation parameter.

3. The asymmetry compensation method according to claim 2, wherein the coordinate offset includes a first x-axis offset and a first y-axis offset, the offset difference includes a second x-axis offset and a second y-axis offset.

4. The asymmetry compensation method according to claim 3, further comprising determining that whether the coordinate offset falls within the x-axis allowable deviation range and the y-axis allowable deviation range or not before calculating the offset difference, wherein if the first x-axis offset falls within the x-axis allowable deviation range, then the second x-axis offset is zero, and if the first y-axis offset falls within the y-axis allowable deviation range, then the second y-axis offset is zero.

5. The asymmetry compensation method according to claim 2, wherein the first multiple is greater than zero, the second multiple is greater than zero and less than 1.

6. The asymmetry compensation method according to claim 2, wherein the first multiple is equal to 1.

7. The asymmetry compensation method according to claim 1, wherein the x-axis final compensation parameter and the y-axis final compensation parameter are further configured for being used in a re-lithography overlay process of the first substrate after removing the first mask layer and the second mask layer, and the re-lithography overlay process includes processing the re-lithography overlay process on the first substrate by using a first mask, a second mask, the x-axis final compensation parameter, and the y-axis final compensation parameter.

8. The asymmetry compensation method according to claim 1, wherein the x-axis final compensation parameter and the y-axis final compensation parameter are further configured for being used in a lithography overlay process of a second substrate, and the lithography overlay process of the second substrate includes processing the lithography overlay process on the second substrate by using a first mask, a second mask, the x-axis final compensation parameter, and the y-axis final compensation parameter.

9. An asymmetry compensation method used in a lithography overlay process, comprising:
providing a first substrate, wherein a circuit layout, a first mask layer, and a second mask layer are disposed on the first substrate, the first mask layer and the second mask layer are stacked sequentially on the circuit layout, wherein the first mask layer has a x-axis allowable deviation range and a y-axis allowable deviation range relative to the circuit layout, the second mask layer has a x-axis allowable deviation range and a y-axis allowable deviation range relative to the circuit layout, the x-axis allowable deviation range is unequal to the y-axis allowable deviation range; and
calculating an x-axis final compensation parameter and an y-axis final compensation parameter based on the unequal x-axis allowable deviation range and the y-axis allowable deviation range, comprising:

obtaining a first x-axis offset and a first y-axis offset of the first mask layer relative to the second mask layer;

determining that whether the first x-axis offset and the first y-axis offset respectively fall within the x-axis allowable deviation range and the y-axis allowable deviation range or not;

calculating an offset difference between the first x-axis offset and the x-axis allowable deviation range as well as between the first y-axis offset and the y-axis allowable deviation range to obtain a second x-axis offset and a second y-axis offset; and calculating a sum of a first multiple of the first x-axis offset and a second multiple of the second x-axis offset to obtain the x-axis final compensation parameter, as well as calculating a sum of the first multiple of the first y-axis offset and the second multiple of the second y-axis offset to obtain the y-axis final compensation parameter, wherein if the first x-axis offset falls within the x-axis allowable deviation range, then the second x-axis offset is zero, and if the first y-axis offset falls within the y-axis allowable deviation range, then the second y-axis offset is zero.

10. The asymmetry compensation method according to claim 9, wherein the first multiple is greater than zero, the second multiple is greater than zero and less than 1.

11. The asymmetry compensation method according to claim 9, wherein the first multiple is equal to 1.

12. The asymmetry compensation method according to claim 9, wherein the x-axis final compensation parameter and the y-axis final compensation parameter are further configured for being used in a re-lithography overlay process of the first substrate after removing the first mask layer and the second mask layer, and the re-lithography overlay process includes processing the re-lithography overlay process on the first substrate by using a first mask, a second mask, the x-axis final compensation parameter, and the y-axis final compensation parameter.

13. The asymmetry compensation method according to claim 9, wherein the x-axis final compensation parameter and the y-axis final compensation parameter are further configured for being used in a lithography overlay process of a second substrate, and the lithography overlay process of the second substrate includes processing the lithography overlay process on the second substrate by using a first mask, a second mask, the x-axis final compensation parameter, and the y-axis final compensation parameter.

* * * * *